(12) United States Patent
Kobayashi et al.

(10) Patent No.: US 11,842,858 B2
(45) Date of Patent: Dec. 12, 2023

(54) IMAGE FORMING APPARATUS

(71) Applicant: CANON KABUSHIKI KAISHA, Tokyo (JP)

(72) Inventors: Junya Kobayashi, Shizuoka (JP); Masaki Inagaki, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/047,436

(22) Filed: Oct. 18, 2022

(65) Prior Publication Data
US 2023/0131664 A1 Apr. 27, 2023

(30) Foreign Application Priority Data
Oct. 21, 2021 (JP) ................. 2021-172313

(51) Int. Cl.
G03G 15/00 (2006.01)
H01G 9/12 (2006.01)
H02M 3/335 (2006.01)
H05K 7/20 (2006.01)

(52) U.S. Cl.
CPC .............. *H01G 9/12* (2013.01); *G03G 15/80* (2013.01); *H02M 3/33523* (2013.01); *H05K 7/209* (2013.01)

(58) Field of Classification Search
CPC .......... G03G 15/00; G03G 15/80; H01G 9/12; H02M 3/35523; H05K 7/209

USPC ......................................................... 399/88
See application file for complete search history.

(56) References Cited

U.S. PATENT DOCUMENTS 11,137,712 B2 * 10/2021 Kuroki ................ H05K 1/0203

FOREIGN PATENT DOCUMENTS

| JP | 2013069646 A | 4/2013 |
|----|--------------|--------|
| JP | 2015189190 A | 11/2015 |
| JP | 2016220420 A | 12/2016 |
| JP | 2017044817 A | 3/2017 |
| JP | 2017076725 A | 4/2017 |
| JP | 6598511 B2 | 10/2019 |

* cited by examiner

*Primary Examiner* — Hoan H Tran
(74) *Attorney, Agent, or Firm* — Canon U.S.A., Inc. IP Division

(57) ABSTRACT

An image forming apparatus includes an image forming unit and a power device. The power device includes a circuit board provided to intersect a horizontal plane. The power device includes an electrolytic capacitor, an electric element, and a plate-shaped member that is provided between the electrolytic capacitor and the electric element in a vertical direction and including a first surface extending in a second direction intersecting the vertical direction. The plate-shaped member includes a cutout or a hole, and a position of at least part of an area where the cutout or the hole is formed is farther in the first direction from the mounting surface of the circuit board than a position of the electric element.

16 Claims, 13 Drawing Sheets

IMAGE FORMING APPARATUS

BACKGROUND OF THE INVENTION

Field of the Invention

The present invention relates to an image forming apparatus that includes a power device including an electrolytic capacitor having an explosion-proof valve.

Description of the Related Art

Power devices that converts commercial alternating current power into direct current power by rectifying and smoothing the commercial alternating current power have been used in image forming apparatuses such as laser beam printers. Such power devices obtain desired output power by inputting the rectified and smoothed direct current power to a transformer and switching the input power, and include a rectification circuit that rectifies input alternating current power and a smoothing circuit that smooths the rectified current.

The smoothing circuit needs a high-capacitance capacitor, so that an electrolytic capacitor is sometimes used. Application of an excessive voltage to the electrolytic capacitor causes gas to be generated inside the capacitor. In order to prevent an increase in pressure in the capacitor due to the gas, the electrolytic capacitor includes a cutout referred to as an explosion-proof valve (also referred to as "pressure valve"). In a case where the explosion-proof valve operates, the gas containing an electrolyte spurts outwardly from the inside of the capacitor. The spurted electrolyte is a conductive liquid, so that adhesion of the electrolyte to a nearby circuit may affect the circuit. Specifically, in a case where the electrolyte adheres to a primary circuit, a short circuit may occur, and this may cause a high current to flow.

Considering such an issue, Japanese Patent No. 6598511 discusses a deflector plate situated to face an explosion-proof valve of an electrolytic capacitor so that an electrolyte spurted in a case where the explosion-proof valve is opened is guided by the deflector plate to areas of circuits that are not likely to be affected by adhesion of the electrolyte. Specifically, the spurted electrolyte is guided to a secondary circuit by the deflector plate without adhering to a primary circuit.

According to Japanese Patent No. 6598511, a circuit board is built in an image forming apparatus such that a mounting surface of the circuit board is substantially in a vertical direction. Further, the electrolytic capacitor mounted on the circuit board extends in a substantially horizontal direction. In such foregoing configuration, the electrolyte spurted in the substantially horizontal direction in a case where the explosion-proof valve is opened is guided to the secondary circuit by the deflector plate situated to face the explosion-proof valve, while some of the electrolyte flows to an area under the electrolytic capacitor in the vertical direction.

With the configuration discussed in Japanese Patent No. 6598511, the above-described issue of short circuits does not occur because the primary circuit is not provided under the electrolytic capacitor in the vertical direction. However, in order to realize circuit layouts with more freedom, an effect of the electrolyte spurted in a case where the explosion-proof valve is opened is desirably reduced even in a configuration in which an electric element is provided under the electrolytic capacitor in the vertical direction.

SUMMARY OF THE INVENTION

The present invention is directed to preventing adhesion of an electrolyte spurted from an electrolytic capacitor to an electric element provided under an electrolytic capacitor in a vertical direction.

According to an aspect of the present invention, an image forming apparatus includes an image forming unit configured to form an image on a recording material, and a power device configured to supply power to the image forming unit, the power device including a circuit board provided to intersect a horizontal plane. The power device includes an electrolytic capacitor including an explosion-proof valve configured to open and spurt an inside electrolyte outwardly in a case where a voltage higher than or equal to a predetermined value is applied, the electrolytic capacitor protruding in a first direction from a mounting surface of the circuit board, an electric element under the electrolytic capacitor in a vertical direction, the electric element being exposed from the mounting surface, and a plate-shaped member provided between the electrolytic capacitor and the electric element in the vertical direction, the plate-shaped member including a first surface extending in a second direction intersecting the vertical direction as viewed in a direction perpendicular to the mounting surface of the circuit board. The plate-shaped member includes a cutout or a hole, and a position of at least part of an area where the cutout or the hole is formed is farther in the first direction from the mounting surface of the circuit board than a position of the electric element.

According to another aspect of the present invention, an image forming apparatus includes an image forming unit configured to form an image on a recording material, and a power device configured to supply power to the image forming unit, the power device including a circuit board provided to intersect a horizontal plane. The power device includes an electrolytic capacitor including an explosion-proof valve configured to open and spurt an inside electrolyte outwardly in a case where a voltage higher than or equal to a predetermined value is applied, the electrolytic capacitor protruding in a first direction from a mounting surface of the circuit board, an electric element under the electrolytic capacitor in a vertical direction, the electric element being exposed from the mounting surface, and a plate-shaped member provided between the electrolytic capacitor and the electric element in the vertical direction, the plate-shaped member including a first surface extending in a second direction intersecting the vertical direction as viewed in a direction perpendicular to the mounting surface of the circuit board. The plate-shaped member protrudes beyond a distal end portion of the electrolytic capacitor in the first direction as viewed along the mounting surface of the circuit board, and the plate-shaped member is tilted with respect to the mounting surface such that, as viewed along the mounting surface of the circuit board, a position of an end portion of the plate-shaped member that is nearest the circuit board in the first direction is higher in the vertical direction than a position of another end portion of the plate-shaped member that is on an opposite side from the circuit board.

Further features of the present invention will become apparent from the following description of exemplary embodiments with reference to the attached drawings.

DESCRIPTION OF THE EMBODIMENTS

Figure 1:
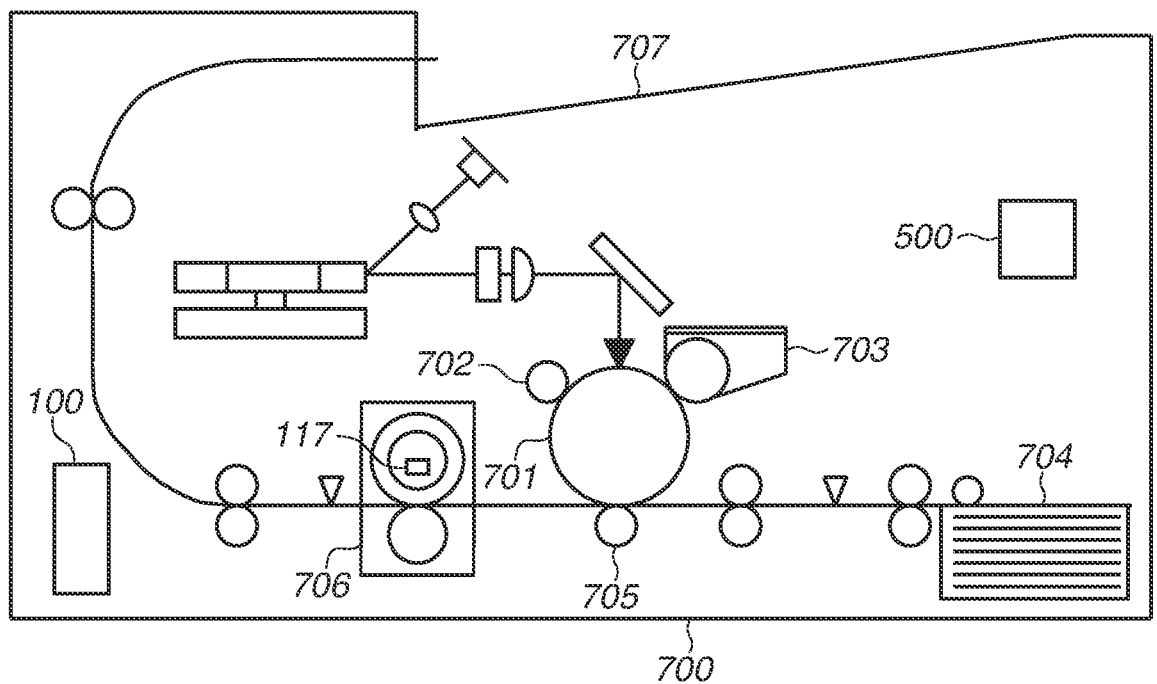
FIG. 1 is an overall schematic view illustrating a laser beam printer.

A power device 100 according to a first exemplary embodiment of the present invention that is applied to an image forming apparatus will now be described. FIG. 1 is an overall view illustrating a laser beam printer 700 (hereinafter, referred to as "printer 700") as an example of an image forming apparatus. The printer 700 includes a photosensitive drum 701, a charging device 702, and a development device 703. The photosensitive drum 701 is an image bearing member on which an electrostatic latent image is to be formed. The charging device 702 uniformly charges the photosensitive drum 701. The development device 703 develops an electrostatic latent image formed on the photosensitive drum 701 using toner. A toner image developed on the photosensitive drum 701 is transferred at a transfer portion 705 to a sheet as a recording material fed from a cassette 704. The transferred toner image on the sheet is then fixed by a fixing device 706 heated by a heater 117. The sheet with the fixed toner image thereon is discharged to a sheet discharge tray 707. The printer 700 includes the power device 100 that supplies power to a driving unit, such as a motor, and to a control unit 500. The control unit 500 controls, for example, the above-described image forming operations, conveying sheets, and a temperature of the heater 117.

Figure 2:
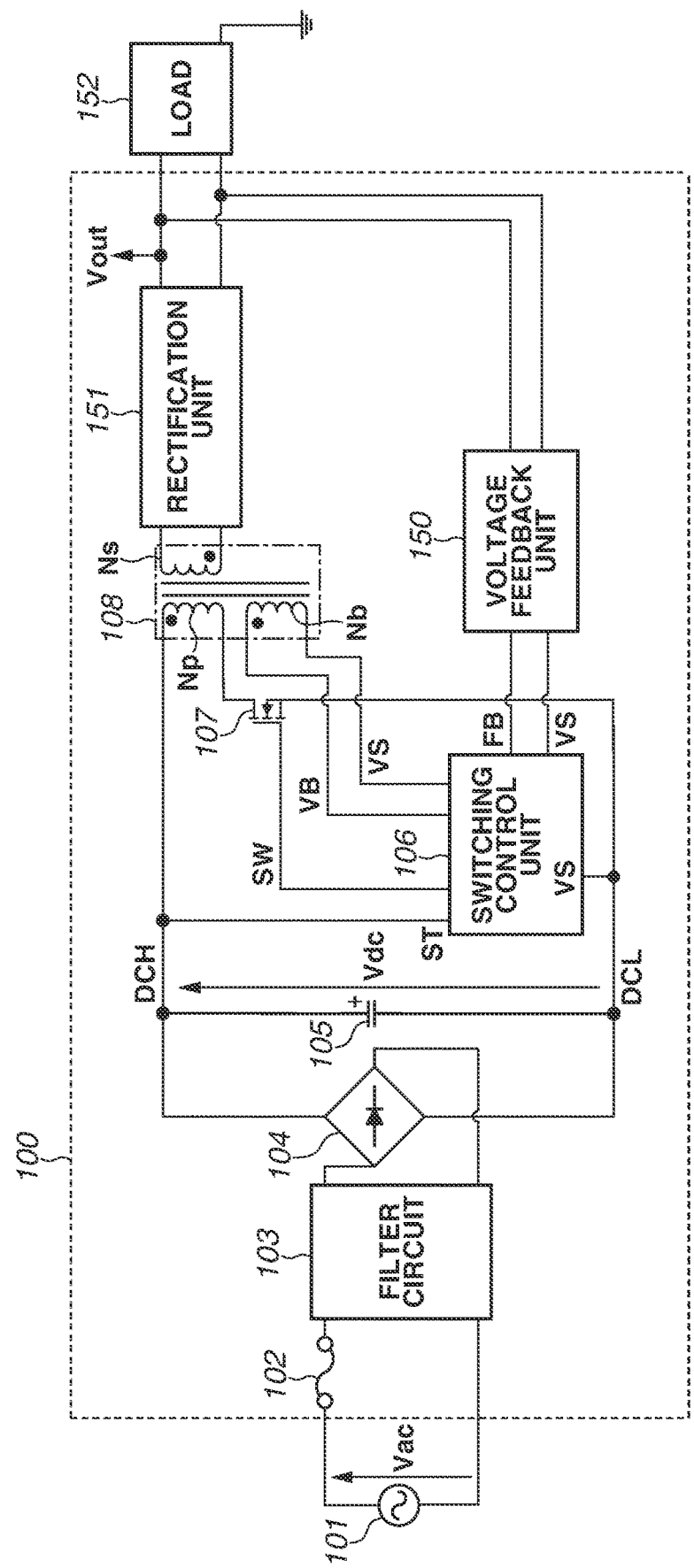
FIG. 2 is a circuit block diagram illustrating a power device.

FIG. 2 is a circuit block diagram illustrating the power device 100 according to the first exemplary embodiment. A flyback-type switching power supply will be described here as an example. An alternating-current voltage Vac is supplied from a commercial power supply 101 to the power device 100. The alternating-current voltage Vac supplied to the power device 100 is supplied to a diode bridge 104 via a fuse 102 and a filter circuit 103. If the alternating-current voltage Vac is rectified by the diode bridge 104, a pulsating current waveform with one side being positive is obtained. The voltage with the pulsating current waveform is smoothed to a substantially direct current by an action of a primary electrolytic capacitor 105. A voltage applied to both ends of the primary electrolytic capacitor 105 will be referred to as "voltage Vdc". A potential of a positive terminal of the primary electrolytic capacitor 105 will be referred to as "potential DCH", and a potential of a negative terminal of the primary electrolytic capacitor 105 will be referred to as "potential DCL".

The smoothed voltage Vdc is input to a primary winding Np of a transformer 108, and is fed back via a field-effect transistor (FET) 107 to the commercial power supply 101 through the negative terminal of the primary electrolytic capacitor 105 and the diode bridge 104. The ON/OFF timings of the FET 107 are controlled by a switching control unit 106. Before the switching is started, the switching control unit 106 acquires operation power from a terminal ST, whereas after the switching is started, the switching control unit 106 acquires operation power from a voltage between terminals VB and VS, which is generated from an auxiliary winding Nb of the transformer 108. The terminal VS of the switching control unit 106 is connected to the potential DCL.

A rectification unit 151 is connected to a secondary winding Ns of the transformer 108. Power converted to a voltage by the transformer 108 is fed to the rectification unit 151, and the rectification unit 151 rectifies and smooths the fed voltage to obtain a direct current voltage Vout. The direct-current voltage Vout is output to a load 152 outside the power device 100. The load 152 includes, for example, a central processing unit (CPU) (not illustrated) of the control unit 500 illustrated in FIG. 1 and the driving unit such as a motor. The direct-current voltage Vout is connected to a voltage feedback unit 150, and the voltage feedback unit 150 outputs information indicating whether the direct-current voltage Vout is a predetermined voltage. Specifically, the voltage feedback unit 150 outputs a voltage as an electric signal between terminals FB and VS of the switching control unit 106. The voltage feedback unit 150 includes primary and secondary circuits insulated from each other, and an element, such as a photocoupler, transmits electric signals from the secondary circuit to the primary circuit. The switching control unit 106 determines the ON/OFF timings of the FET 107 based on a voltage value between the terminals FB and VS and controls the output voltage Vout to be a predetermined voltage value.

Figure 3:
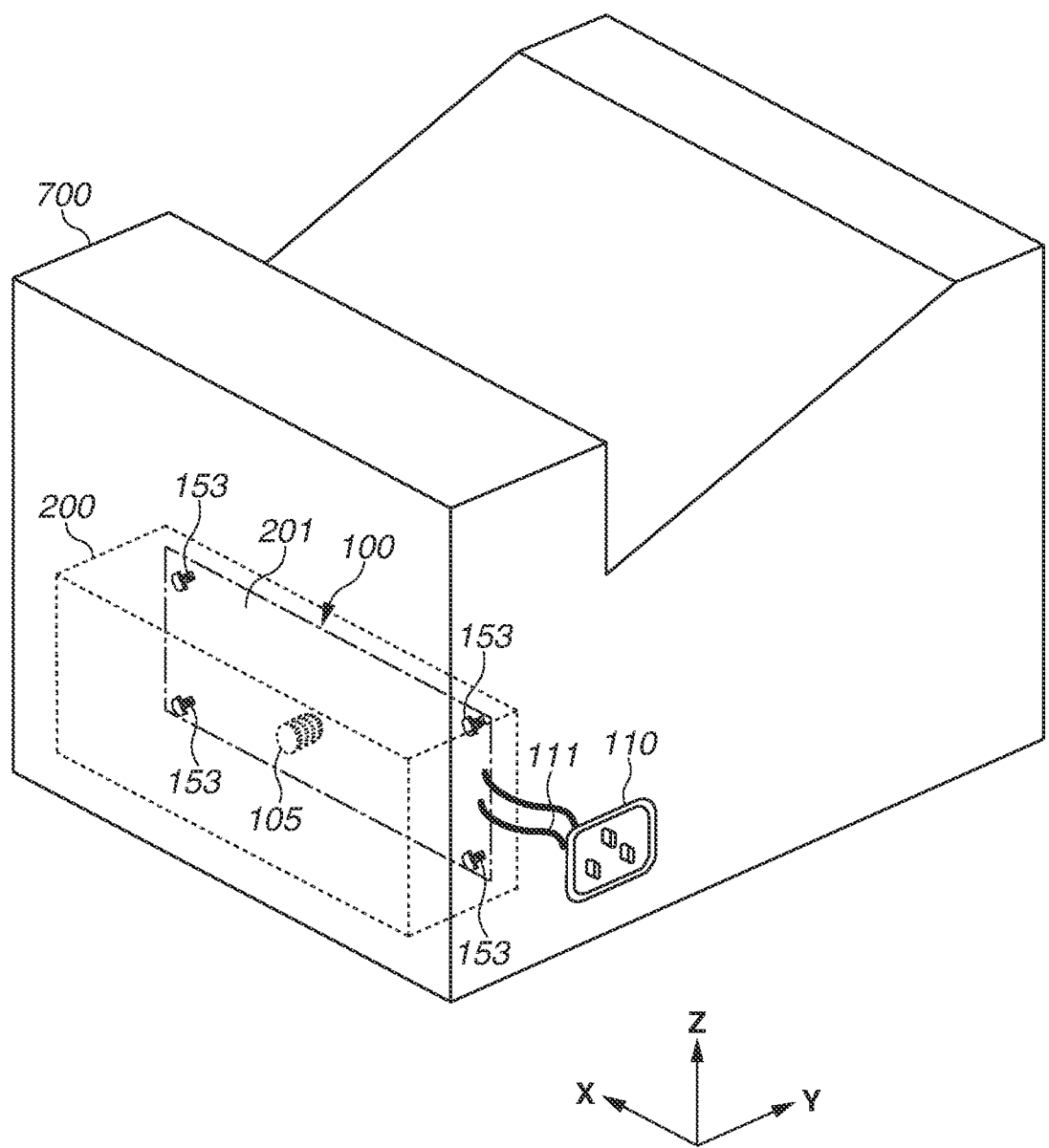
FIG. 3 is a view illustrating a layout and a configuration of the power device in the laser beam printer.

A layout of the power device 100 in the printer 700 will now be described with reference to FIG. 3. In FIG. 3, a height direction (direction opposite to the vertical direction) of the printer 700 placed on a horizontal surface is defined as a Z-direction. A direction that intersects the Z-direction and is parallel to a rotation axis direction (main scan direction) of the photosensitive drum 701 (illustrated in FIG. 1) is defined as an X-direction. A direction that intersects the X-direction and Z-direction is defined as a Y-direction. The X-, Y-, and Z-directions desirably intersect perpendicularly to each other. The XYZ directions also apply to the subsequent drawings.

As illustrated in FIG. 3, the printer 700 includes a power supply casing 200 therein. The power supply casing 200 is a box-shaped member specified by a dotted line and includes the power device 100 therein. The power device 100 includes a circuit board 201 specified by a dash-dot-dash line and the primary electrolytic capacitor 105 mounted on the circuit board 201. As described above, the power device 100 further includes various other electric elements, but illustrations thereof are omitted in FIG. 3.

The circuit board 201 is situated substantially perpendicularly to a horizontal plane, and a surface of the circuit board 201 extends substantially parallel to an XZ plane. The circuit board 201 is also fixed to an inner wall of the power supply casing 200 with screws 153. The primary electrolytic capacitor 105 is mounted on the circuit board 201 such that the electrolytic capacitor 105 protrudes toward a negative side in the Y-direction. In contrast, the commercial power supply 101 (illustrated in FIG. 2) is connected to an inlet 110 via a power supply cable (not illustrated), and the inlet 110 is connected to the power device 100 via cables 111.

Figure 4:
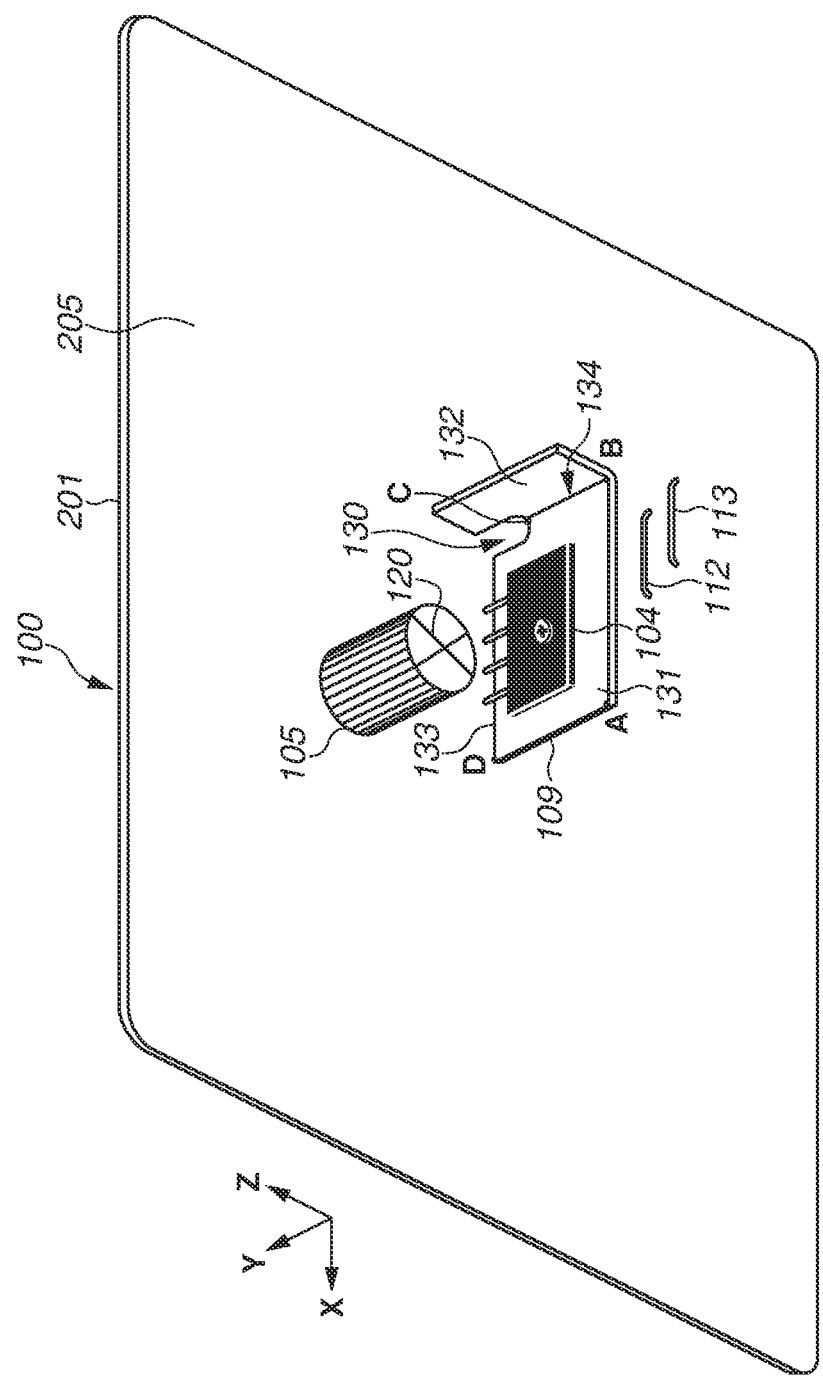
FIG. 4 is a perspective view illustrating the power device including a heatsink with a cutout according to a first exemplary embodiment.

FIG. 4 is a perspective view illustrating a configuration of the power device 100 according to the present exemplary embodiment. Only major components are illustrated in FIG. 4. The circuit board 201 includes the primary electrolytic capacitor 105, the diode bridge 104, a heatsink 109 (plate-shaped member), and jumper wires 112 and 113 (electric elements) in this order from the top in the Z-direction. A surface of the circuit board 201 on the negative side in the Y-direction on which the foregoing components are mounted is referred to as a mounting surface 205. The diode bridge 104 among the components on the circuit board 201 is likely to generate heat, and therefore the diode bridge 104 is mounted directly on the heatsink 109 to be in contact with the heatsink 109. The jumper wires 112 and 113 are electric elements for pattern wiring of the circuit board 201. The jumper wire 112 has a potential equal to the potential DCL, and the jumper wire 113 has a potential equal to the potential DCH.

As described above, the primary electrolytic capacitor 105 protrudes toward the negative side in the Y-direction, and an explosion-proof valve 120 (also referred to as "pressure valve") is provided to a distal end of the primary electrolytic capacitor 105. In a case where a voltage that is higher than or equal to a predetermined value is applied to the primary electrolytic capacitor 105 due to an abnormality, the explosion-proof valve 120 opens and releases gas containing an electrolyte outwardly, whereby an increase in pressure in the primary electrolytic capacitor 105 is prevented. Since the electrolyte is a conductive liquid, adhesion of the electrolyte to a path between the jumper wires 112 and 113, which are two electric elements having a different potential from each other, may cause a short circuit at the path, and this may cause an excessive current to flow. Thus, adhesion of the electrolyte to electronic components such as the jumper wires 112 and 113 needs to be prevented.

In order to prevent adhesion of the electrolyte to the jumper wires 112 and 113, the heatsink 109 between the primary electrolytic capacitor 105 and the jumper wires 112 and 113 in the vertical direction has a devised shape in the configuration according to the present exemplary embodiment. As illustrated in FIG. 4, the heatsink 109 includes a cutout 130. The cutout 130 is formed in a side 133 near the circuit board 201 in the direction (the negative side in the Y-direction) in which the primary electrolytic capacitor 105 protrudes. Further, the heatsink 109 includes one bent portion and surfaces 131 and 132. The diode bridge 104 is mounted on the surface 131 (predetermined surface), and the surface 132 intersects the surface 131 substantially perpendicularly to the surface 131. The cutout 130 is formed at a bent portion 134 where the two surfaces 131 and 132 intersect.

The four corners of the surface 131 of the heatsink 109 will be referred to as points A, B, C, and D. The point A is positioned at an end portion of the surface 131 on the negative side in the Y-direction and a positive side in the X-direction. The point B is positioned at an end portion of the surface 131 on the negative side in the Y-direction and a negative side in the X-direction. The point C is positioned at an end portion of the cutout 130 on the negative side in the Y-direction. The point D is positioned at an end portion of the surface 131 on a positive side in the Y-direction and the positive side in the X-direction.

The heatsink 109 is basically mounted substantially perpendicularly to the mounting surface 205 of the circuit board 201. In reality, however, the heatsink 109 may be mounted slightly obliquely to the circuit board 201 within an accuracy variation range. Thus, in the configuration illustrated in FIG. 4 in which the jumper wires 112 and 113 are situated under the point C in the vertical direction, adhesion of the electrolyte to the jumper wires 112 and 113 needs to be prevented regardless of in which direction the heatsink 109 is tilted. FIGS. 5 to 8 below illustrate states where the heatsink 109 tilted in different directions is mounted.

Figure 5:
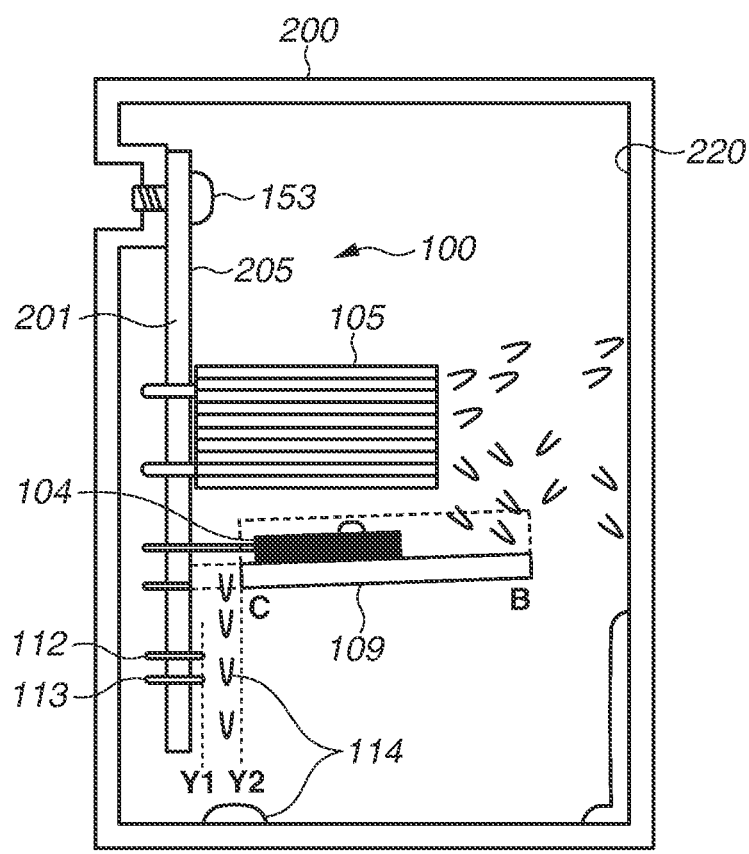
FIG. 5 is a cross-sectional view illustrating the power device with an electrolyte falling down from a point C.

FIG. 5 is a view illustrating the power device 100 and the power supply casing 200 as viewed along the mounting surface 205 of the circuit board 201. Specifically, FIG. 5 is a view illustrating the power device 100 and the power supply casing 200 as viewed from the positive side to the negative side in the X-direction. FIG. 5 illustrates a state where the explosion-proof valve 120 opens and an electrolyte 114 spurted from the primary electrolytic capacitor 105 is scattered in different directions and adheres to an inner wall 220, which faces the primary electrolytic capacitor 105, of the power supply casing 200 and an upper surface of the heatsink 109. The heatsink 109 is tilted with respect to the mounting surface 205, and in FIG. 5, a position (the point C) of an end portion of the heatsink 109 that is near the circuit board 201 is lower in the vertical direction than a position (the point B) of another end portion of the heatsink 109 that is on an opposite side from the circuit board 201.

In FIG. 5, the heatsink 109 is tilted, so that the electrolyte 114 scattered onto the heatsink 109 flows from the point B to the point C. Since the heatsink 109 includes the cutout 130 (illustrated in FIG. 4), the electrolyte 114 falls downward in the vertical direction from the point C. As illustrated in FIG. 5, a position Y2 of the point C in the Y-direction is farther from the circuit board 201 than a position Y1 of the jumper wires 112 and 113 exposed from the mounting surface 205 in the Y-direction is from the circuit board 201. Specifically, a position of at least part of an area where the cutout 130 is formed is farther in the Y-direction from the mounting surface 205 of the circuit board 201 than the position of the jumper wires 112 and 113 is from the circuit board 201. Thus, the electrolyte 114 having fallen from the point C falls to a bottom surface of the power supply casing 200 without adhering to the jumper wires 112 and 113.

Specifically, with the cutout 130, the electrolyte 114 that previously falls after being guided to a position near the circuit board 201 falls from a position far from the circuit board 201. This prevents adhesion of the electrolyte 114 to the jumper wires 112 and 113 situated under the primary electrolytic capacitor 105 in the vertical direction.

Figure 6:
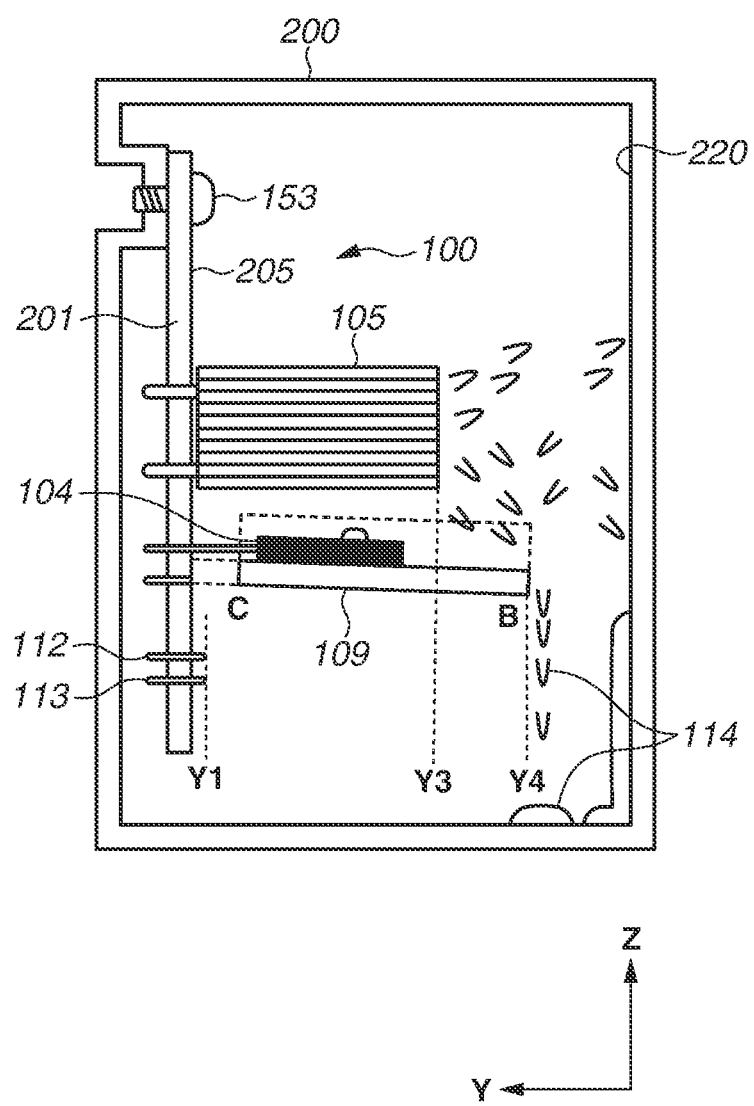
FIG. 6 is a cross-sectional view illustrating the power device with the electrolyte falling down from a point B.

FIG. 6 illustrates a state where the heatsink 109 is tilted in a direction opposite to the tilt direction illustrated in FIG. 5. In FIG. 6, the position (the point C) of the end portion of the heatsink 109 that is near the circuit board 201 is higher in the vertical direction than the position (the point B) of the other end portion of the heatsink 109 that is on the opposite side from the circuit board 201. In this case, the electrolyte 114 scattered onto the heatsink 109 flows from the point C to the point B, so that the electrolyte 114 falls downward in the vertical direction from the point B in FIG. 6. As illustrated in FIG. 6, a position Y4 of the point B in the Y-direction is farther from the circuit board 201 than the position Y1 of the jumper wires 112 and 113 exposed from the mounting surface 205 in the Y-direction is from the circuit board 201. Thus, the electrolyte 114 having fallen from the point B falls to the bottom surface of the power supply casing 200 without adhering to the jumper wires 112 and 113.

The position Y4 of the point B in the Y-direction is also farther from the circuit board 201 than a position Y3 of a distal end portion of the primary electrolytic capacitor 105 is from the circuit board 201. In other words, the heatsink 109 protrudes beyond the primary electrolytic capacitor 105 from the circuit board 201. Thus, the heatsink 109 plays a role as a kind of an umbrella for the jumper wires 112 and 113 and prevents the electrolyte 114 spurted from the distal end portion of the primary electrolytic capacitor 105 from being reflected by the inner wall 220 and adhering to the jumper wires 112 and 113. This effect is similarly obtained also in the state illustrated in FIG. 5.

Figure 7:
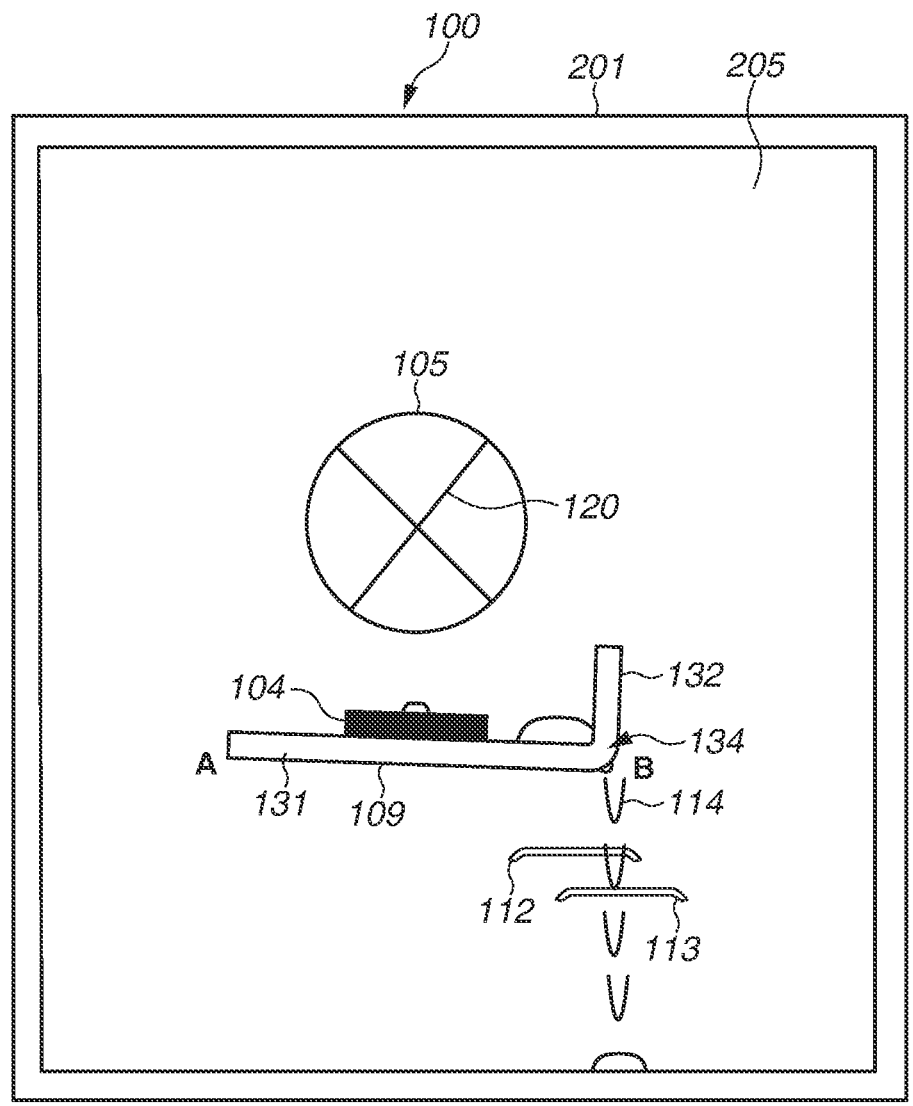
FIG. 7 is a front view illustrating the power device with the heatsink tilted toward the point B.

FIG. 7 is a diagram illustrating the power device 100 as viewed from a direction perpendicular to the mounting surface 205 of the circuit board 201. Specifically, FIG. 7 is a diagram illustrating the power device 100 as viewed from the negative side to the positive side in the Y-direction. Further, as illustrated in FIG. 7, the surface 131 of the heatsink 109 on which the diode bridge 104 is mounted extends in a direction intersecting the perpendicular direction, and the surface 131 is tilted with respect to the horizontal direction such that the position of the point A is higher in the vertical direction than the position of the point B.

In this case, the electrolyte 114 scattered onto the heatsink 109 flows to a downstream end in the vertical direction, i.e., from the point A to the point B. Since the surface 131 of the heatsink 109 is tilted with respect to the horizontal direction, the electrolyte 114 is guided to the bent portion 134. The bent portion 134 is formed by bending the heatsink 109, whereby the electrolyte 114 having flown to the point B is accumulated at the bent portion 134. Thereafter, as illustrated in FIG. 5 or 6, the electrolyte 114 gathered at the bent portion 134 flows to the point B or C depending on the direction in which the heatsink 109 is tilted. In both states, the electrolyte 114 does not adhere to the jumper wires 112 and 113 as described above with reference to FIGS. 5 and 6.

Figure 8:
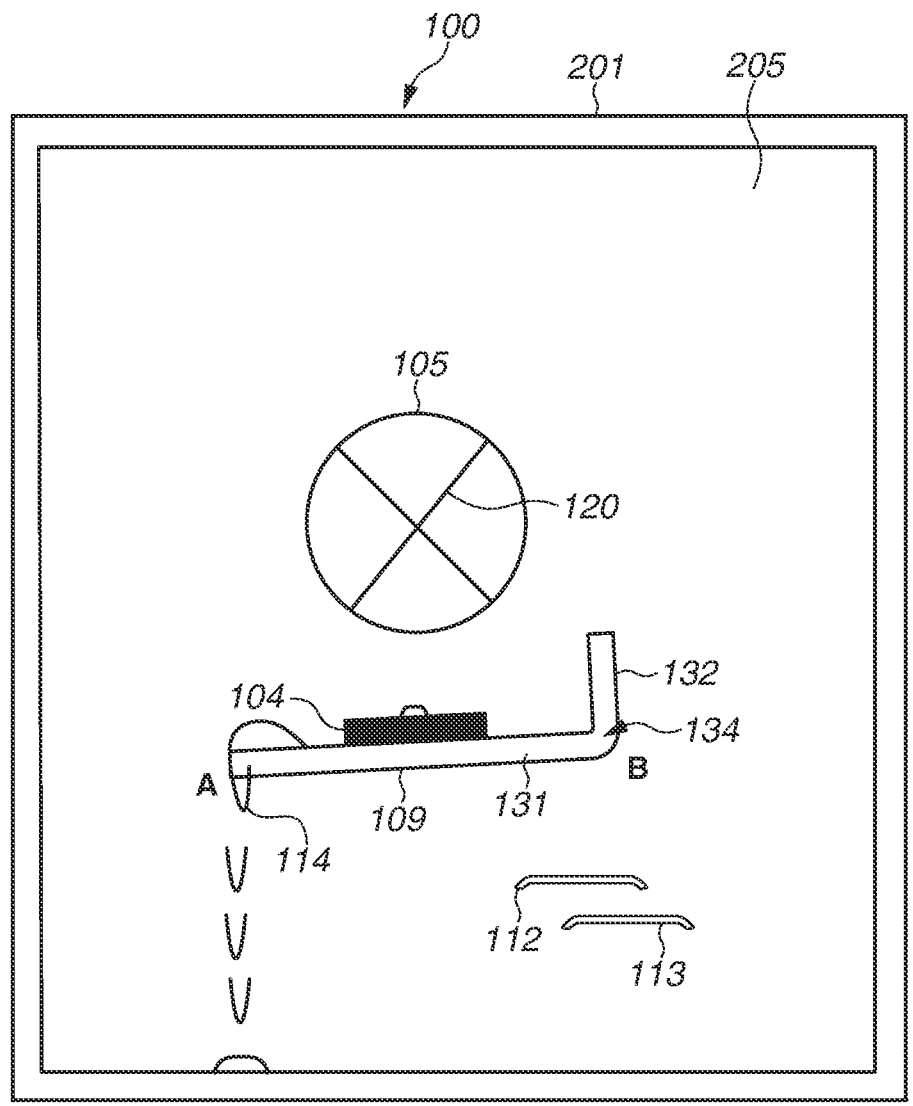
FIG. 8 is a front view illustrating the power device with the heatsink tilted toward the point A.

FIG. 8 illustrates a state where the heatsink 109 is tilted in a direction opposite to the tilt direction illustrated in FIG. 7. In FIG. 7, the surface 131 of the heatsink 109 extends in the direction intersecting the perpendicular direction, and the surface 131 is tilted such that the position of the point A is lower in the vertical direction than the position of the point B. In this configuration, the electrolyte 114 scattered onto the heatsink 109 flows from the point B to the point A and falls to an area far from the position of the jumper wires 112 and 113 in the X-direction.

The above prevents adhesion of the electrolyte 114 to the jumper wires 112 and 113.

As described above, the configuration in which the jumper wires 112 and 113 are provided under the point C in the vertical direction includes the cutout 130 to prevent adhesion of the electrolyte 114 to the electric element regardless of in which direction the heatsink 109 is tilted.

While FIGS. 5 to 8 illustrate the heatsink 109 tilted with respect to the mounting surface 205 of the circuit board 201, the heatsink 109 can be not tilted with respect to the mounting surface 205 and can be substantially perpendicular to the mounting surface 205.

While the jumper wires 112 and 113 are provided under the point C in the vertical direction in the above-described configuration, a cutout can be formed at a position near the point D in a case where the jumper wires 112 and 113 are provided under the point D in the vertical direction. This configuration will be described below.

Figure 9:
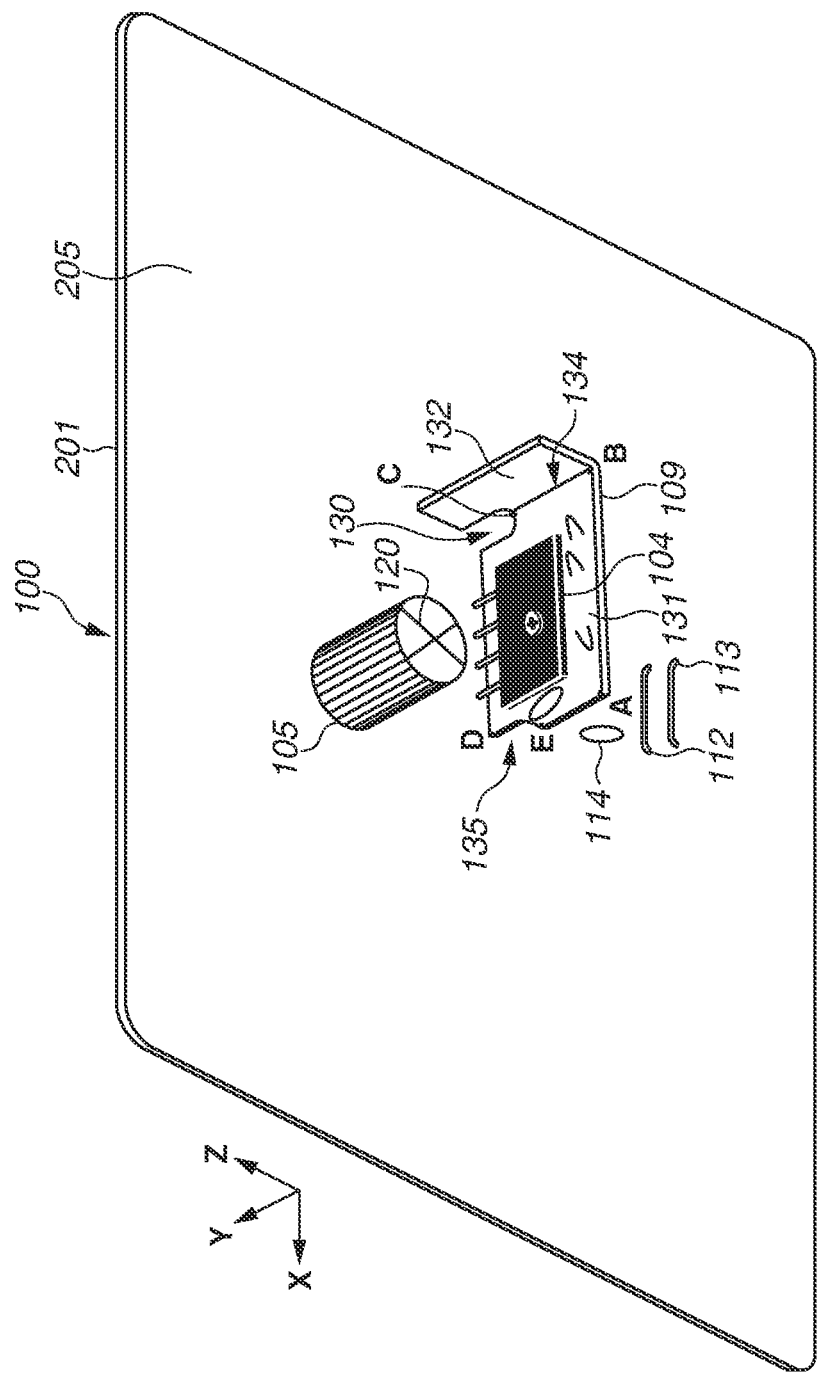
FIG. 9 is a perspective view illustrating the power device including the heatsink with a new cutout according to the first exemplary embodiment.

FIG. 9 is a perspective view illustrating the power device 100 with the jumper wires 112 and 113 provided under the point D in the vertical direction. The heatsink 109 includes not only the cutout 130 but also a cutout 135 near the point D. A point E is positioned at an end portion of the cutout 135 on the negative side in the Y-direction. The cutout 130 is optional.

Figure 10:
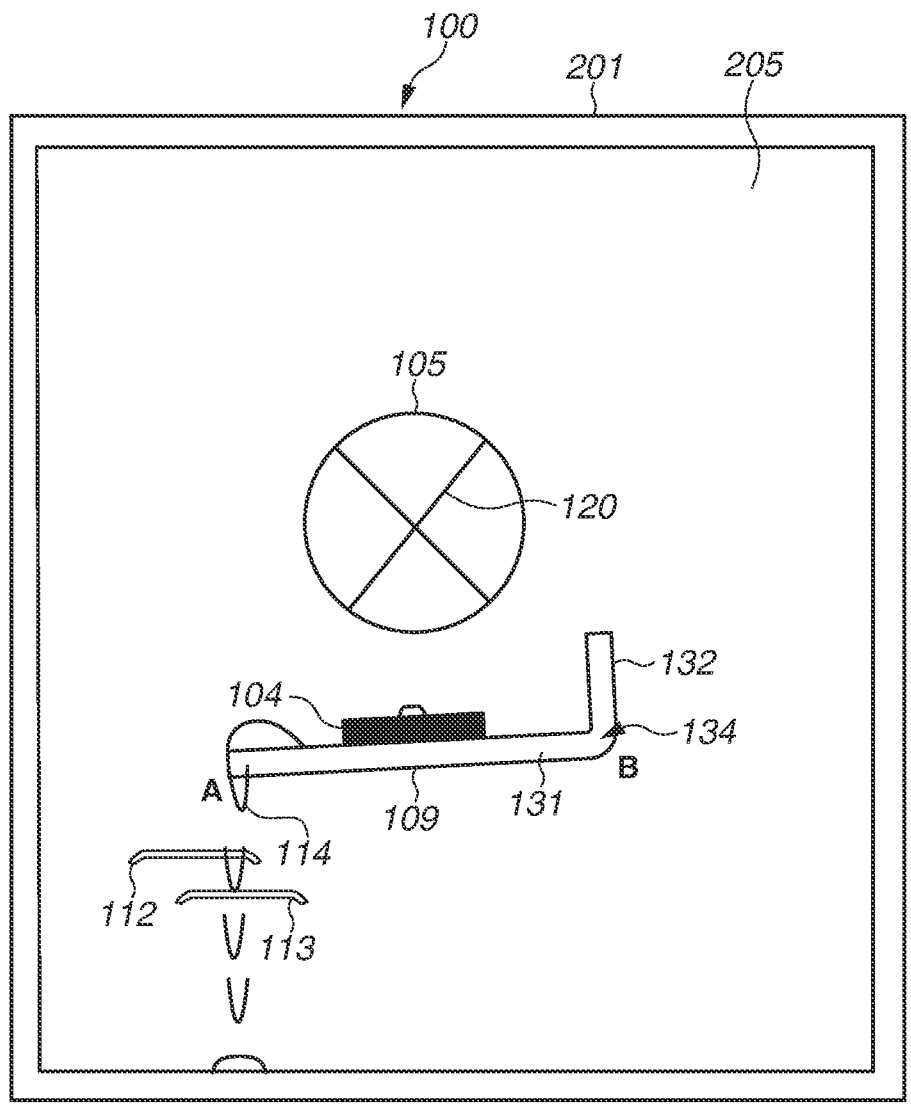
FIG. 10 is a front view illustrating the power device with the heatsink tilted toward the point A.

FIG. 10 is a view illustrating the power device 100 in FIG. 8 as viewed from a direction perpendicular to the mounting surface 205 of the circuit board 201. FIG. 10 illustrates a state where the surface 131 of the heatsink 109 is tilted with respect to the horizontal direction due to an effect of accuracy variations. Since the surface 131 is tilted such that the position of the point B is higher in the vertical direction than the position of the point A, the electrolyte 114 scattered onto the heatsink 109 flows from the point B to the point A.

Figure 11:
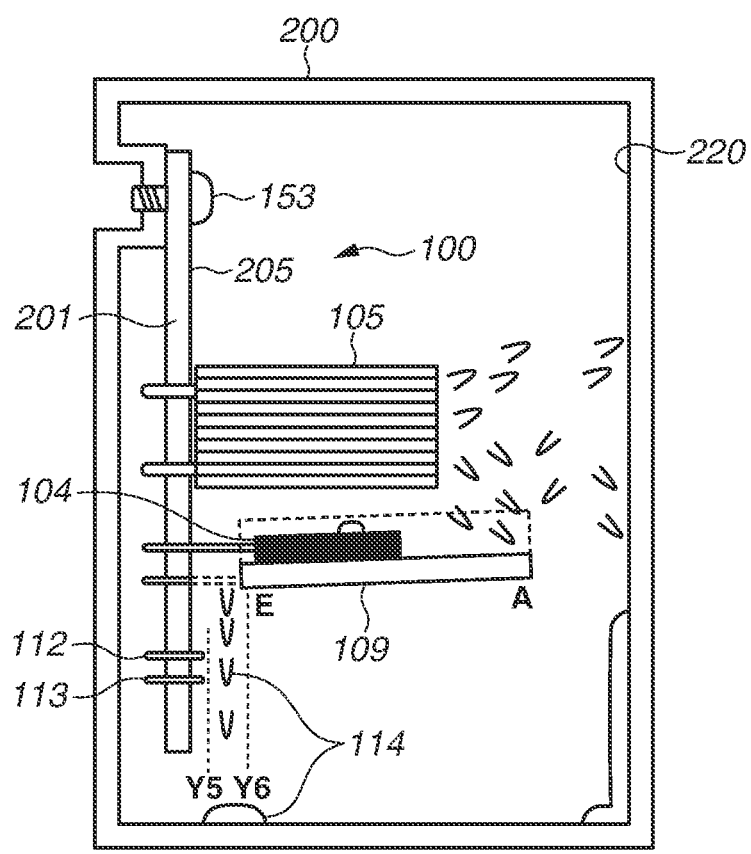
FIG. 11 is a cross-sectional view illustrating the power device with the electrolyte falling down from a point E.

FIG. 11 is a view illustrating the power device 100 and the power supply casing 200 in FIG. 8 as viewed along the mounting surface 205 of the circuit board 201. In the configuration illustrated in FIG. 10, since the position of the point E is lower in the vertical direction than the position of the point A, the electrolyte 114 flows from the point A to the point E. Consequently, the electrolyte 114 falls downward in the vertical direction from the point E. A position Y6 of the point E in the Y-direction is farther from the circuit board 201 than a position Y5 of the jumper wires 112 and 113 exposed from the mounting surface 205 in the Y-direction is from the circuit board 201. Thus, the electrolyte 114 having fallen from the point E falls to the bottom surface of the power supply casing 200 without adhering to the jumper wires 112 and 113.

The state where the heatsink 109 is tilted and mounted in a direction different from the tilt directions illustrated in FIGS. 10 and 11 is similar to those described above with reference to FIGS. 5 to 8, and therefore redundant descriptions thereof are omitted.

As described above, the configuration in which the jumper wires 112 and 113 are provided under the point D in the vertical direction includes the cutout 135 to prevent adhesion of the electrolyte 114 to the jumper wires 112 and 113.

Figure 12:
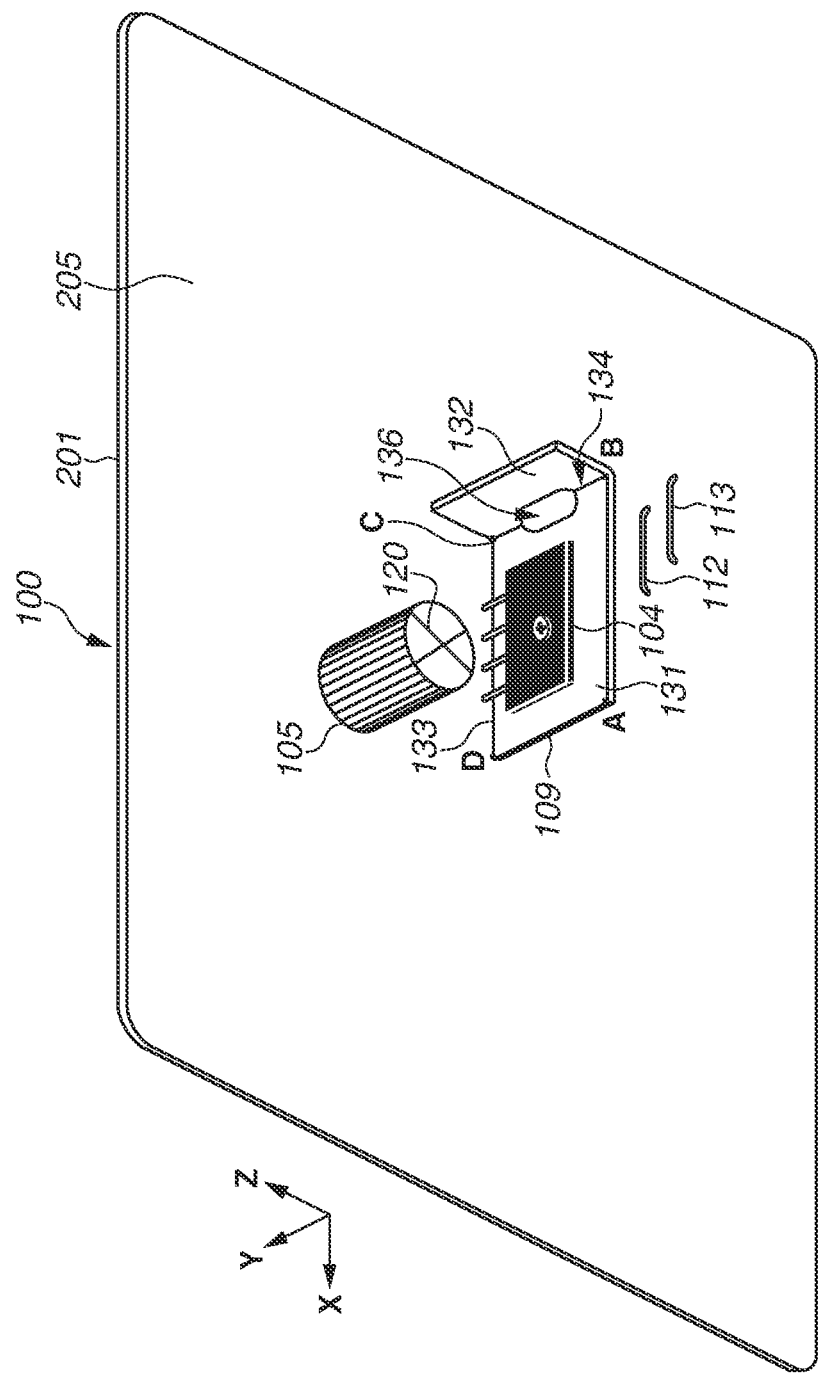
FIG. 12 is a perspective view illustrating the power device including the heatsink with a hole according to the first exemplary embodiment.

While the cutouts are formed in the end portions of the heatsink 109 in the above-described configurations according to the first exemplary embodiment, aspects of the present invention are not limited to the configurations described above. As illustrated in FIG. 12, the heatsink 109 can include a hole 136 therein. The electrolyte 114 scattered onto the heatsink 109 falls downward in the vertical direction from the hole 136 at a position far from the mounting surface 205 of the circuit board 201. This configuration similarly prevents adhesion of the electrolyte 114 to the jumper wires 112 and 113.

Further, while the above-described configurations according to the first exemplary embodiment include a cutout or a hole at the bent portion 134 of the heatsink 109, aspects of the present invention are not limited to the configurations. For example, while the cutout 130 is positioned at the bent portion 134, i.e., at the downstream end of the heatsink 109 in the vertical direction that is tilted with respect to the horizontal direction in FIG. 7, the cutout 130 can be formed at a position that is slightly shifted to the positive side in the X-direction from the bent portion 134.

As described above, according to the present exemplary embodiment, the heatsink 109 includes a cutout or a hole to prevent the electrolyte 114 spurted from the primary electrolytic capacitor 105 from adhering to the jumper wires 112 and 113.

The above-described configurations according to the first exemplary embodiment prevent adhesion of the electrolyte 114 to the jumper wires 112 and 113 using the heatsink 109 mounted on the circuit board 201. However, there may be a case where the power device 100 does not include the heatsink 109.

According to a second exemplary embodiment, a dedicated member for preventing adhesion of the electrolyte 114 to the jumper wires 112 and 113 is intentionally tilted with respect to the mounting surface 205 to be mounted on the mounting surface 205 in the tilted state. A basic apparatus configuration of the second exemplary embodiment is similar to that according to the first exemplary embodiment, and thus redundant descriptions thereof are omitted. A configuration that is different from the first exemplary embodiment will be described here.

Figure 13:
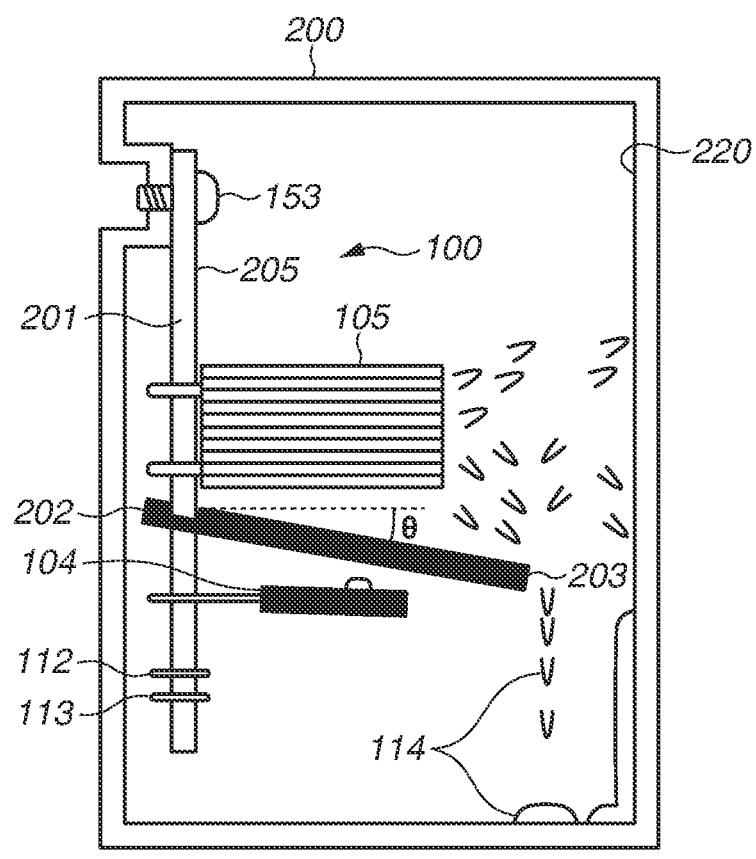
FIG. 13 is a cross-sectional view of a power device including a guide plate according to a second exemplary embodiment.

FIG. 13 illustrates a configuration of the power device 100 that includes a guide plate 202 (plate-shaped member) for guiding the electrolyte 114. FIG. 13 is a diagram illustrating the power device 100 as viewed along the mounting surface 205 of the circuit board 201. In FIG. 13, the guide plate 202 is positioned between the primary electrolytic capacitor 105 and the diode bridge 104 in the Z-direction, and is installed so as to incline in the −Z direction as the distance from the circuit board 201 increases.

The guide plate 202 is a member for guiding the electrolyte 114 to a position far from the jumper wires 112 and 113. The guide plate 202 is, for example, a resin member. Further, the guide plate 202 is mounted on the circuit board 201 in a state of being intentionally tilted with respect to the mounting surface 205 rather than being tilted within the accuracy variation range. Specifically, a tilt angle θ of the guide plate 202 with respect to an extension line extending perpendicularly to the mounting surface 205 of the circuit board 201 is desirably 10 degrees or greater.

In this configuration, the electrolyte 114 having adhered to the guide plate 202 flows to the negative side in the Y-direction and falls in the negative Z-direction from a distal end portion 203 of the guide plate 202 on the negative side in the Y-direction. Thus, the electrolyte 114 falls to the bottom surface of the power supply casing 200 without adhering to the jumper wires 112 and 113.

As described above, according to the present exemplary embodiment, the guide plate 202 for guiding the electrolyte 114 is provided to prevent adhesion of the electrolyte 114 spurted from the primary electrolytic capacitor 105 to the jumper wires 112 and 113 even in a case where a plate-shaped member such as the heatsink 109 is not provided.

MODIFIED EXAMPLES

While the heatsink 109 includes a cutout or a hole in the configurations according to the first exemplary embodiment, aspects of the present invention are not limited to the configurations. The guide plate 202 according to the second exemplary embodiment can be provided in place of the heatsink 109, and a cutout or a hole can be formed in the guide plate 202.

Further, while the guide plate 202 is intentionally tilted and mounted on the mounting surface 205 in the configuration according to the second exemplary embodiment, aspects of the present invention are not limited to the configuration. The heatsink 109 according to the first exemplary embodiment can be provided in place of the guide plate 202, and the heatsink 109 can be intentionally tilted and mounted on the mounting surface 205.

Further, while the diode bridge 104 is mounted on the heatsink 109 according to the first and second exemplary embodiments, aspects of the present invention are not limited to the configurations. The FET 107, which is a switching element, and a rectification diode (not illustrated) of the rectification unit 151 of the secondary circuit are other components that are likely to generate heat, and these components can be in contact with the heatsink 109.

While the jumper wires 112 and 113 are described as an example of an electric element provided under the primary electrolytic capacitor 105 in the vertical direction according to the first and second exemplary embodiments, the two electric elements do not necessarily have to be provided. For example, only the jumper wire 112 can be provided. In this case, adhesion of the electrolyte 114 to an area near the jumper wire 112 may cause a short circuit between the jumper wire 112 and the bottom surface of the power supply casing 200 or the ground. Further, since the heatsink 109 has a predetermined potential, a short circuit may occur between the jumper wire 112 and the heatsink 109. Furthermore, the electric element is not limited to the jumper wire 112 and can be another electric element provided to the primary circuit of the transformer 108, such as a resistor or a diode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-172313, filed Oct. 21, 2021, which is hereby incorporated by reference herein in its entirety.

What is claimed is:

1. An image forming apparatus comprising:
an image forming unit configured to form an image on a recording material; and
a power device configured to supply power to the image forming unit, the power device including a circuit board provided to intersect a horizontal plane,
wherein the power device includes:
an electrolytic capacitor including an explosion-proof valve configured to open and spurt an inside electrolyte outwardly in a case where a voltage higher than or equal to a predetermined value is applied, the electrolytic capacitor protruding in a first direction from a mounting surface of the circuit board;
an electric element under the electrolytic capacitor in a vertical direction, the electric element being exposed from the mounting surface; and
a plate-shaped member provided between the electrolytic capacitor and the electric element in the vertical direction, the plate-shaped member including a first surface extending in a second direction intersecting the vertical direction as viewed in a direction perpendicular to the mounting surface of the circuit board,
wherein the plate-shaped member includes a cutout or a hole, and a position of at least part of an area where the cutout or the hole is formed is farther in the first direction from the mounting surface of the circuit board than a position of the electric element.

2. The image forming apparatus according to claim 1, wherein the plate-shaped member includes the cutout formed in a side nearest the circuit board in the first direction, and a position of an end portion of the cutout that is on an opposite side from the circuit board is farther in the first direction from the mounting surface of the circuit board than the position of the electric element is.

3. The image forming apparatus according to claim 1, wherein the plate-shaped member includes at least one bent portion and includes a second surface intersecting the first surface besides the first surface, and the cutout or the hole is formed at the bent portion where the first surface and the second surface intersect.

4. The image forming apparatus according to claim 1, wherein the second direction is tilted with respect to a horizontal direction as viewed from the direction perpendicular to the mounting surface of the circuit board, and the cutout or the hole is formed in a downstream end of the plate-shaped member in the vertical direction.

5. The image forming apparatus according to claim 1, wherein the plate-shaped member is tilted with respect to the mounting surface such that, as viewed along the mounting surface of the circuit board, a position of an end portion of the plate-shaped member that is nearest the circuit board in the first direction is lower in the vertical direction than a position of another end portion of the plate-shaped member that is on an opposite side from the circuit board.

6. The image forming apparatus according to claim 1, wherein the plate-shaped member protrudes beyond a distal end portion of the electrolytic capacitor in the first direction as viewed along the mounting surface of the circuit board.

7. The image forming apparatus according to claim 1, wherein the plate-shaped member is a heatsink configured to release heat from the power device.

8. The image forming apparatus according to claim 7, further comprising a diode bridge configured to convert an alternating current supplied from a commercial power supply into a direct current,
wherein the diode bridge is in contact with the heatsink.

9. The image forming apparatus according to claim 1, wherein the plate-shaped member is a guide plate configured to guide the electrolyte in a predetermined direction.

10. The image forming apparatus according to claim 1, further comprising a transformer having a primary winding and a secondary winding and configured to output a voltage to the secondary winding in accordance with a voltage input to the primary winding,
wherein the electric element is a jumper wire provided to a primary circuit of the transformer.

11. An image forming apparatus comprising:
an image forming unit configured to form an image on a recording material; and
a power device configured to supply power to the image forming unit, the power device including a circuit board provided to intersect a horizontal plane,
wherein the power device includes:
an electrolytic capacitor including an explosion-proof valve configured to open and spurt an inside electrolyte outwardly in a case where a voltage higher than or equal to a predetermined value is applied, the electrolytic capacitor protruding in a first direction from a mounting surface of the circuit board;
an electric element under the electrolytic capacitor in a vertical direction, the electric element being exposed from the mounting surface; and
a plate-shaped member provided between the electrolytic capacitor and the electric element in the vertical direction, the plate-shaped member including a first surface extending in a second direction intersecting the vertical direction as viewed in a direction perpendicular to the mounting surface of the circuit board,
wherein the plate-shaped member protrudes beyond a distal end portion of the electrolytic capacitor in the first direction as viewed along the mounting surface of the circuit board, and the plate-shaped member is tilted with respect to the mounting surface such that, as viewed along the mounting surface of the circuit board, a position of an end portion of the plate-shaped member that is nearest the circuit board in the first direction is higher in the vertical direction than a position of another end portion of the plate-shaped member that is on an opposite side from the circuit board.

12. The image forming apparatus according to claim 11, wherein the plate-shaped member is tilted by greater than or equal to 10 degrees with respect to the direction perpendicular to the mounting surface of the circuit board.

13. The image forming apparatus according to claim 11, the plate-shaped member is a heatsink configured to release heat from the power device.

14. The image forming apparatus according to claim 13, further comprising a diode bridge configured to convert an alternating current supplied from a commercial power supply into a direct current,
wherein the diode bridge is in contact with the heatsink.

15. The image forming apparatus according to claim 11, wherein the plate-shaped member is a guide plate configured to guide the electrolyte in a predetermined direction.

16. The image forming apparatus according to claim 11, further comprising a transformer having a primary winding and a secondary winding and configured to output a voltage to the secondary winding in accordance with a voltage input to the primary winding,
wherein the electric element is a jumper wire provided to a primary circuit of the transformer.

* * * * *